(12) United States Patent
Yoshida et al.

(10) Patent No.: US 7,961,474 B2
(45) Date of Patent: Jun. 14, 2011

(54) HEAT DISSIPATION DEVICE AND POWER MODULE

(75) Inventors: Tadafumi Yoshida, Nissin (JP); Hiroki Tashiro, Aichi-ken (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 12/684,160

(22) Filed: Jan. 8, 2010

(65) Prior Publication Data

US 2010/0172104 A1   Jul. 8, 2010

(30) Foreign Application Priority Data

Jan. 8, 2009   (JP) ................................. 2009-002472

(51) Int. Cl.
   *H05K 7/20*   (2006.01)
   *H01L 23/36*   (2006.01)

(52) U.S. Cl. ........ 361/719; 361/702; 361/703; 361/709; 361/710; 361/711; 165/80.2; 165/80.4; 165/151; 165/152; 165/174

(58) Field of Classification Search ............. 361/679.47, 361/679.53, 679.54, 698–712, 715–721, 361/679.46; 165/80.2, 80.3, 80.4, 80.5, 104.32, 165/104.33, 148, 151, 152, 165, 170, 173, 165/174, 185; 174/16.3, 252; 62/259.2; 257/713–718

See application file for complete search history.

(56) References Cited

U.S. PATENT DOCUMENTS

| 3,327,776 | A | * | 6/1967 | Butt | 165/80.4 |
| 4,478,277 | A | * | 10/1984 | Friedman et al. | 165/185 |
| 6,305,463 | B1 | * | 10/2001 | Salmonson | 165/80.3 |
| 6,390,182 | B1 | * | 5/2002 | Sauer | 165/80.3 |
| 6,719,039 | B2 | * | 4/2004 | Calaman et al. | 165/80.4 |
| 7,212,407 | B2 | * | 5/2007 | Beihoff et al. | 361/699 |
| 7,215,545 | B1 | * | 5/2007 | Moghaddam et al. | 361/699 |
| 7,254,030 | B2 | * | 8/2007 | Chiba et al. | 361/710 |
| 7,571,759 | B2 | * | 8/2009 | Inagaki et al. | 165/80.4 |
| 7,757,752 | B2 | * | 7/2010 | Egawa et al. | 165/170 |

FOREIGN PATENT DOCUMENTS

| JP | 08204369 A | 8/1996 |
| JP | 2006310486 A | 11/2006 |
| JP | 2008124187 A | 5/2008 |
| WO | WO 2006118031 A1 * | 11/2006 |

* cited by examiner

*Primary Examiner* — Michael V Datskovskiy (74) *Attorney, Agent, or Firm* — Gifford, Krass, Sprinkle, Anderson & Citkowski, P.C.

(57) ABSTRACT

A radiator having a radiator fin sandwiched between and joined to a top plate and a bottom plate is provided on an insulating substrate, which has a semiconductor element arranged on one face side thereof, on the other face side thereof. The radiator fin is a corrugated fin that includes a first region that includes a joint peak portion joined to the bottom plate and has a height in an amplitude direction which is substantially equal to a distance between the top plate and the bottom plate, and a second region that includes a non-joint peak portion separated from the bottom plate by a predetermined gap and has a height in the amplitude direction which is smaller than the distance between the top plate and the bottom plate.

12 Claims, 6 Drawing Sheets

HEAT DISSIPATION DEVICE AND POWER MODULE

INCORPORATION BY REFERENCE

The disclosure of Japanese Patent Application No. 2009-002472 filed on Jan. 8, 2009 including the specification, drawings and abstract is incorporated herein by reference in its entirety.

BACKGROUND OF THE INVENTION

1. Field of the Invention

The invention relates to a heat dissipation device and a power module.

2. Description of the Related Art

Figure 6:
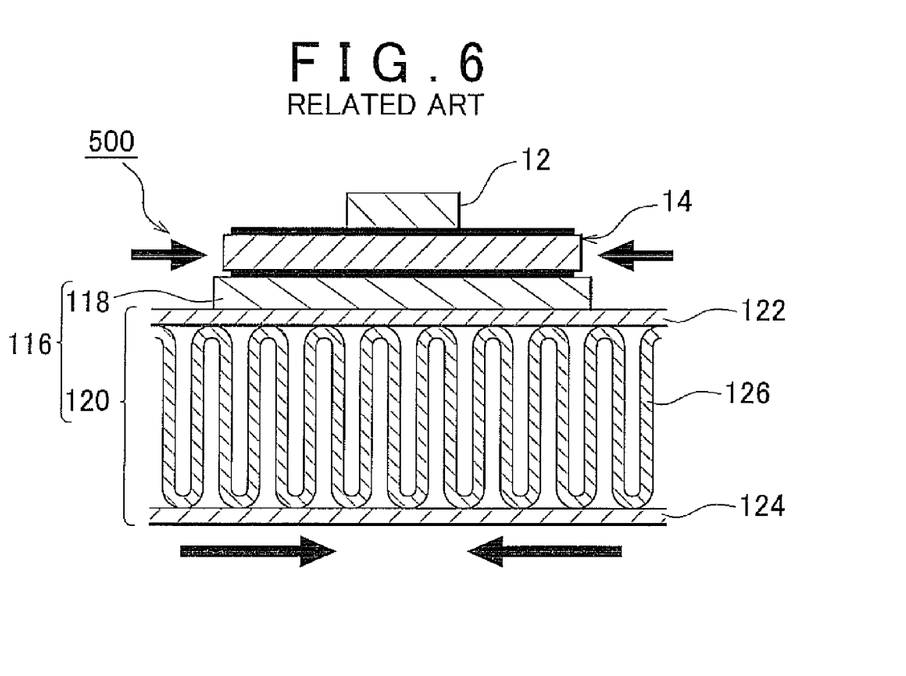
FIG. 6 is a cross-sectional view exemplifying the outline of the structure of a power module according to a related art.

A power module according to the related art will be described. A power module 500 shown in FIG. 6 includes a semiconductor element 12 joined to one face of an insulating substrate 14 and a heat dissipation device 116 joined to the other face side of the insulating substrate 14. A circuit is formed on one or both faces of the insulating substrate 14 according to a direct bonding aluminum (DBA) method, a direct bonding copper (DBC) method, or the like. The heat dissipation device 116 includes a radiator 120 and a heat dissipation plate 118. The heat dissipation plate 118 is provided if necessary. The heat dissipation device 116 radiates heat from the semiconductor element 12 that has been transferred via the insulating substrate 14, from the radiator 120. The radiator 120 includes a radiator fin 126.

Figure 7:
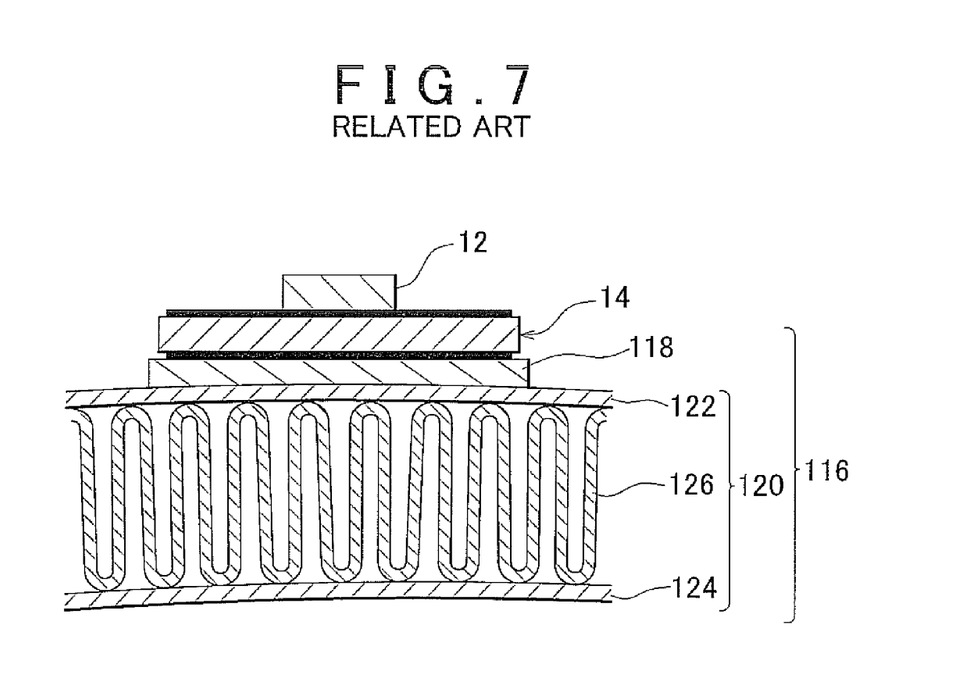
FIG. 7 is a cross-sectional view exemplifying how a heat dissipation device is deformed in the power module shown in FIG. 6.

In the described power module 500, a method of brazing the insulating substrate 14 and the heat dissipation device 116 (the heat dissipation plate 118), which generally differ in linear expansion coefficient, at high temperatures, such as about 600° C., and cooling them is applied in order to join these components to each other. In this case, the insulating substrate 14 and the heat dissipation device 116 contract in returning to a room temperature after having been brazed. The degree of contraction of the insulating substrate 14 and the heat dissipation device 116 differs depending on the difference in linear expansion coefficient the two components. That is, the heat dissipation device 116, which has a relatively large linear expansion coefficient (about $23 \times 10^{-6}$/K in an example (aluminum) of a material with high thermal conductivity such as aluminum, aluminum alloy, copper, brass, or the like) contracts more than the insulating substrate 14, which has a relatively small linear expansion coefficient (about $4.5 \times 10^{-6}$/K in an example (aluminum nitride) of a ceramic insulating material). Therefore, when the insulating substrate 14 and the heat dissipation device 116 are cooled to room temperature (e.g., 25° C.) according to a known cooling method such as cooling ice melting or the like, the radiator 120, which includes planar members 122 and 124, and the heat dissipation device 116 may become deformed, as shown in FIG. 7. When the radiator 120 and the heat dissipation device 116 are further deformed, a decline in the joint strength between the insulating substrate 14 and the heat dissipation device 116 and deterioration in the durability of the power module may result.

For example, as described in Japanese Patent Application Publication No. 2008-124187 (JP-A-2008-124187), Japanese Patent Application Publication No. 2006-294699 (JP-A-2006-294699), Japanese Patent Application Publication No. 2006-202884 (JP-A-2006-202884), and Japanese Patent Application Publication No. 2006-310486 (JP-A-2006-310486), there are various methods for preventing or reducing the extent of warping between an insulating substrate and a heat dissipation device and/or a heat dissipation plate.

JP-A-2008-124187 and JP-A-2006-294699 describe a plate material, in which a through-hole is formed, sandwiched between and joined to an insulating substrate and a radiator fin to relieve stress.

JP-A-2006-202884 describes that a heat dissipating plate is concavely warped beforehand toward an insulating substrate side to be restrained from being warped after being joined to the insulating substrate.

JP-A-2006-310486 describes a power module that includes a corrugated fin that is joined on only an insulating substrate side and is not joined on the opposite side of the insulating substrate.

SUMMARY OF THE INVENTION (US)

The invention provides a heat dissipation device and a power module that relieve a thermal stress to prevent or restrain the heat dissipation device from becoming deformed while maintaining heat dissipation performance.

A configuration according to a first aspect of the invention is as follows.

(1) A heat dissipation device according to the first aspect of the invention is provided on one face side of an insulating substrate, which has a semiconductor element disposed on the other face side thereof. The heat dissipation device includes a first planar member that includes an insulating substrate-side joint face joined to the insulating substrate, and a first joint face on the side of the first planar member opposite the insulating substrate-side joint face; a second planar member that includes a second joint face that faces the first joint face; and a radiator fin that is corrugated and arranged between the first planar member and the second planar member, wherein a peak portion of the radiator fin is joined to the first joint face, and the radiator fin includes a first region that has a height in an amplitude direction which is equal to a distance between the first planar member and the second planar member and includes a joint peak portion joined to the second joint face and a second region that has a height in the amplitude direction which is shorter than the distance between the first planar member and the second planar member and includes a non-joint peak portion separated from the second joint face by a gap.

(2) In the foregoing first aspect of the invention, the second planar member may have a heating element fixing face that is located on the side of the second joint face opposite from the second joint face to fix a heating element.

(3) Further, the heating element may be a reactor or a DC/DC converter.

(4) A power module according to a second aspect of the invention includes an insulating substrate; a semiconductor element provided on one face of the insulating substrate; a first planar member arranged on an opposite face side of the insulating substrate from the semiconductor element that includes an insulating substrate-side joint face joined to the insulating substrate, and a first joint face on the side of the first planar member opposite the insulating substrate-side joint face; a second planar member that includes a second joint face that faces the first joint face; and a radiator fin that is corrugated and arranged between the first planar member and the second planar member, wherein a peak portion of the radiator fin is joined to the first joint face, and the radiator fin includes a first region that has a height in an amplitude direction which is equal to a distance between the first planar member and the second planar member and includes a joint peak portion joined to the second joint face and a second region that has a height in the amplitude direction which is shorter than the distance between the first planar member and the second planar member and includes a non-joint peak portion separated from the second joint face by a gap.

(5) In the foregoing second aspect of the invention, the power module may further include a heating element that is fixed to that face of the second planar member opposite from the second joint face.

(6) Further, a heat conductive grease may be applied between the second planar member and the heating element.

(7) Furthermore, the heating element may be a reactor or a DC/DC converter.

(8) In the power module according to the foregoing second aspect of the invention, portions of the radiator fin joined to the first planar member on a side opposite from where the insulating substrate is joined to the first planar member may include the joint peak portion and the non-joint peak portion; and portions of the radiator fin joined to the first planar member on the side opposite from where the insulating substrate is not joined to the first planar member may include only joint peak portions.

According to the aspects of the invention, the heat radiating device is prevented or restrained from being deformed while maintaining heat dissipation.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

The embodiments of the invention will be described below using the drawings. In the respective drawings, like components are denoted by like reference symbols and are not described repeatedly.

Figure 1:
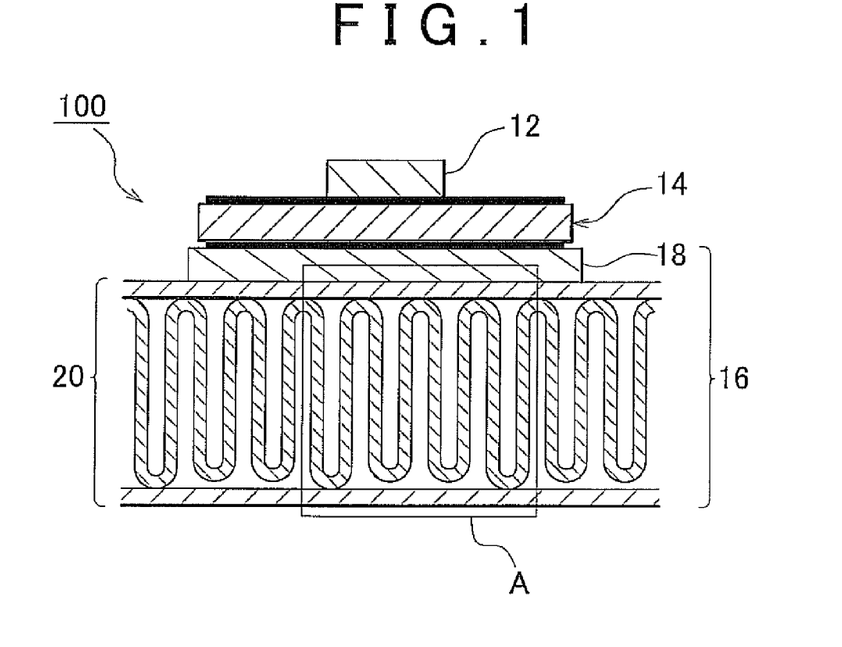
FIG. 1 is a cross-sectional view of the outline of the structure of a power module according to a first embodiment of the invention.

FIG. 1 is a cross-sectional view showing the outline of the structure of a power module according to one embodiment of the invention. A power module 100 shown in FIG. 1 is substantially identical to the power module 500 shown in FIG. 6 except that the power module 100 is equipped with a heat dissipation device 16 instead of the heat dissipation device 116. The heat dissipation device 16 includes a radiator 20, and may further include, if necessary, a heat dissipation plate 18 substantially identical in construction to the heat dissipation plate 118 shown in FIG. 6.

Figure 2:
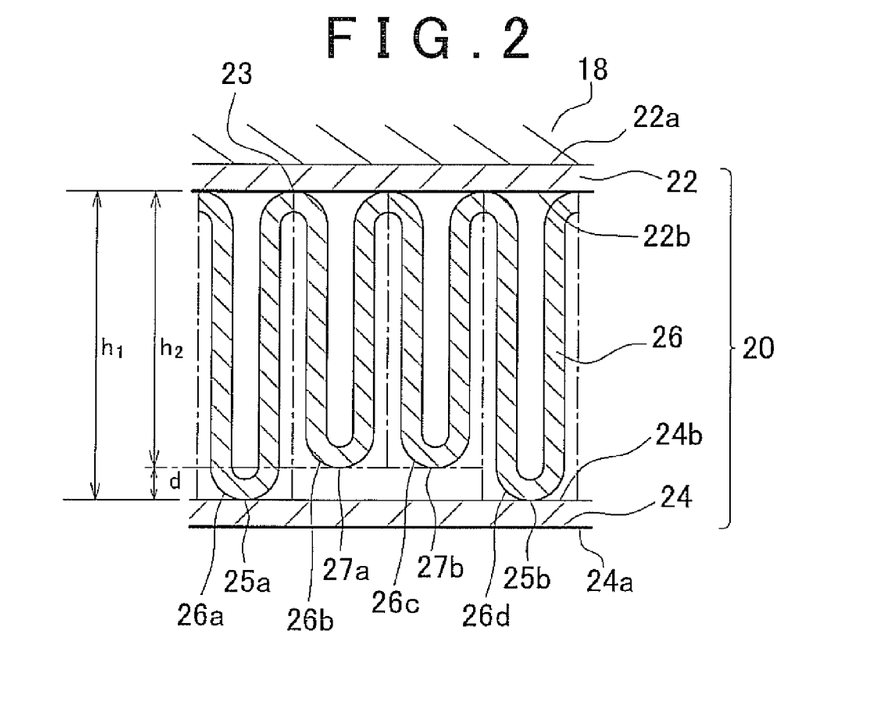
FIG. 2 is an enlarged view showing an area A shown in FIG. 1.

FIG. 2 is an enlarged view showing an area A of FIG. 1 in particular to further explain the structure of the heat dissipation device 16 shown in FIG. 1. In FIG. 2, the radiator 20 includes a top plate 22 (referred to also as a first planar member) and a bottom plate 24 (referred to also as a second planar member) on opposite sides of a radiator fin 26 substantially in parallel with each other. The top plate 22 and the bottom plate 24 are planar plate members that are substantially identical in construction to each other.

In FIG. 2, the top plate 22 includes an insulating substrate-side joint face 22a joined to a member on the insulating substrate 14 side (the heat dissipating plate 18 in this embodiment of the invention), and a radiator fin joint face (referred to also as a first radiator fin joint face) 22b that is joined to the radiator fin 26. On the other hand, the bottom plate 24 includes a radiator fin joint face (referred to also as a second radiator fin joint face) 24b that is at least partially joined to the radiator fin 26.

In addition, the radiator fin 26 is a so-called corrugated fin formed from a plate member that is formed into the desired corrugated shape, and includes a top plate-side peak portion 23 joined to the first radiator fin joint face 22b of the top plate 22, bottom plate-side joint peak portions 25a and 25b joined to the second radiator fin joint face 24b of the bottom plate 24, and bottom plate-side non-joint peak portions 27a and 27b separated from the second radiator fin joint face 24b.

Figure 3:
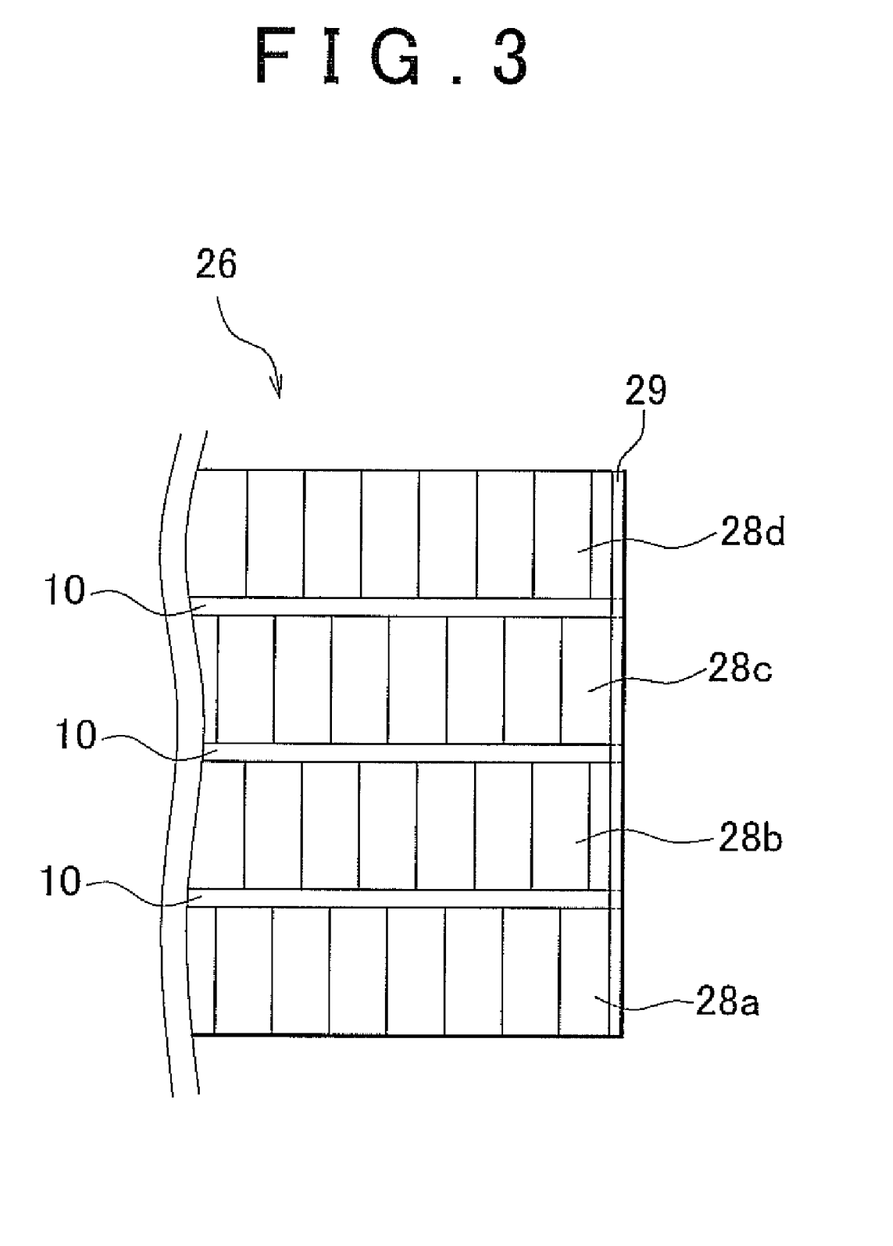
FIG. 3 is a top view of a radiator fin 26, as viewed from a top plate 22 side shown in FIG. 2.

FIG. 3 is a top view of the radiator fin 26 of the embodiment of the invention, as viewed from the top plate 22 side shown in FIG. 2. To improve heat dissipation, the radiator fin 26 shown in FIG. 3 can adopt a so-called offset fin arrangement with corrugated regions 28a, 28b, 28c, and 28d and gaps 10. In this arrangement, each pair of the corrugated regions 28a and 28b, the corrugated regions 28b and 28c, and the corrugated regions 28c and 28d are adjacent to each other across a corresponding one of the gaps 10 and different in phase from each other. The gaps 10 have a width of, for example, about 0.3 to 3.0 mm. Further, to improve operability and the forming accuracy of an end product, the corrugated regions 28a, 28b, 28c, and 28d, which are adjacently arranged across the gaps 10 respectively, may be integrally formed by connecting together at least ends 29 of the corrugated regions 28a, 28b, 28c, and 28d on one side or some ends of the corrugated regions 28a, 28b, 28c, and 28d on both sides. It should be noted that the radiator fin 26 shown in FIG. 3 is merely an example and not restrictive. That is, the gaps 10 may be arranged according to need. Further, the corrugated regions 28a, 28b, 28c, and 28d may all be equal in phase to one another. The corrugated regions 28a, 28b, 28c, and 28d may also be formed separately and arranged appropriately.

As shown in FIG. 2, the radiator fin 26 constructed as described above includes the bottom plate-side joint peak portions 25a and 25b. Those regions 26a and 26d (first regions) of the radiator fin 26 which are joined to the bottom plate 24 have a height ($h_1$) in an amplitude direction which is substantially equal to a distance between the top plate 22 and the bottom plate 24. The top plate 22 or the bottom plate 24 is joined to abutting peak portions of the radiator fin 26 according to a method such as brazing or the like. However, the regions 26b and 26c (second regions) of the radiator fin 26 which are not joined to the bottom plate 24 have a height ($h_2$) in the amplitude direction that is smaller than the distance between the top plate 22 and the bottom plate 24. The regions 26b and 26c face the second radiator fin joint face 24b and are separated from the second radiator fin joint face 24b by a predetermined distance d.

In the radiator 20 constructed as described above, the second regions 26b and 26c of the radiator fin 26 are not joined to the bottom plate 24. Therefore, a thermal stress generated due to differences in linear expansion coefficient among the respective members constituting the insulating substrate 14 and the heat dissipation device 16 is unlikely to be transmitted to the bottom plate 24. As a result, deformation of the heat dissipation device 16, including warpage of the bottom plate 24 and the like, is suppressed. On the other hand, the first regions 26a and 26d of the radiator fin 26 are joined to the bottom plate 24. Therefore, heat dissipation performance can be ensured as well.

In this embodiment of the invention, the first regions of the radiator fin 26 shown in FIG. 2 where the bottom plate-side peak portions are joined to the bottom plate 24 and the second regions of the radiator fin 26 where the bottom plate-side peak portions are not joined to the bottom plate 24 are not absolutely required to have the same ratio or sequence as in the case of the radiator 20 shown in FIGS. 1 and 2. For example, the ratio and sequence of the first regions and the second regions may be appropriately set in accordance with various conditions, for example, the exothermic properties of the semiconductor element 12 shown in FIG. 1, the magnitude of the difference in linear expansion coefficient between the insulating substrate 14 and the heat dissipation device 16, the physical strength of the radiator 20, and the like. However, in order to uniformly prevent or restrain the heat dissipation device 16 from becoming deformed, it is preferable that at least the first regions (the regions 26a and 26d in FIG. 2) be arranged equidistantly.

In this embodiment of the invention, the radiator fin 26 has a generally U-shaped or S-shaped corrugated cross-section. However, the invention should not be limited to this cross-sectional shape. For example, the cross-sectional shape of the radiator fin 26 may be appropriately set as a triangular waveform, a sinusoidal waveform, a rectangular waveform, or any suitable waveform similar thereto.

Further, in this embodiment of the invention, the distance d shown in FIG. 2 may assume any value and is not limited in particular as long as this value does not allow the radiator fin 26 to be joined to the bottom plate 24. However, the distance d can be set to, for example, about 0.2 to 1 mm in accordance with, for example, the forming accuracy of the radiator fin 26 and the joint accuracy of brazing or the like. If the distance d exceeds 1 mm, heat dissipation may deteriorate depending on the composition or thickness of the bottom plate 24.

Figure 4:
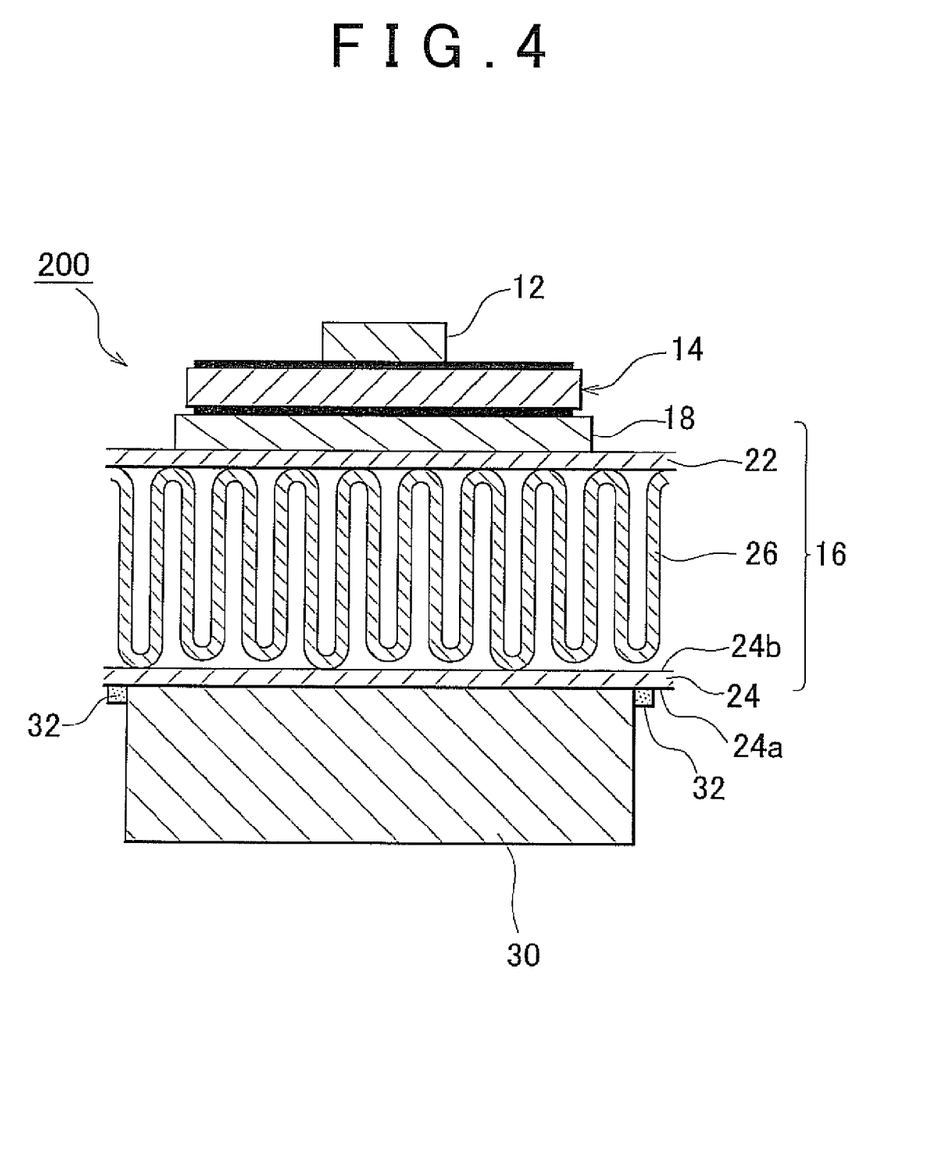
FIG. 4 is a cross-sectional view showing the outline of the structure of a power module according to a second embodiment of the invention.

FIG. 4 is a cross-sectional view showing the outline of the structure of a power module according to a second embodiment of the invention. The power module 200 shown in FIG. 4 is substantially identical to the power module 100 shown in FIG. 1, but differs in that it includes a heating element 30 on an outer face 24a of the bottom plate 24. The heating element 30 is located on the other side of the radiator fin joint face 24b.

Figure 8:
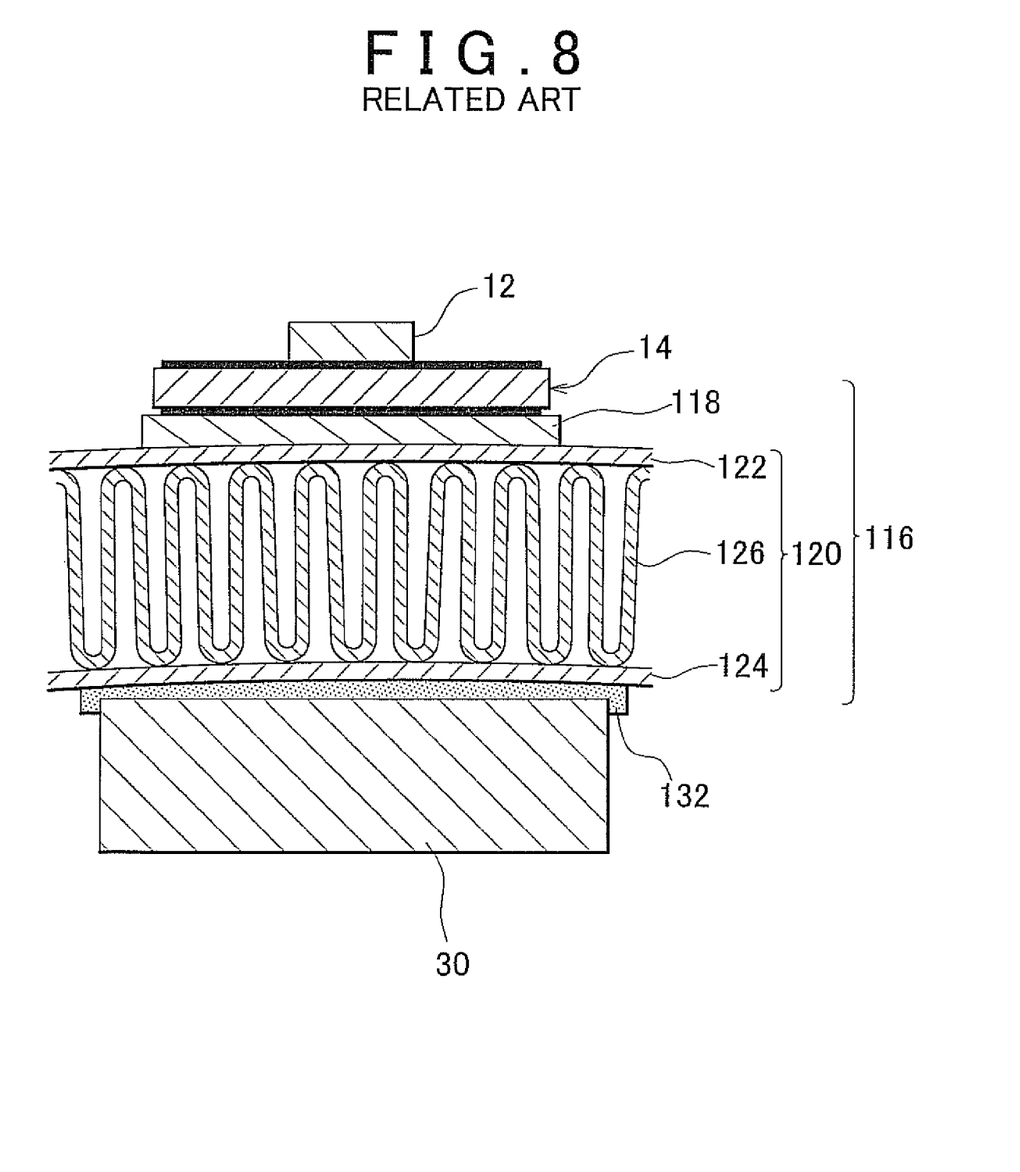
FIG. 8 is a cross-sectional view exemplifying the outline of the structure of a power module having a heating element arranged on a bottom plate side of a radiator shown in FIG. 7.

As shown in FIG. 7, in the case of the power module with the deformed bottom plate 124, when the heating element 30 is further arranged outside the bottom plate 124, the heating element 30 needs to be fixed to the bottom plate 124 with a heat conductive grease 132 or the like sandwiched in a space between the heating element 30, as shown in FIG. 8. In some cases, insufficient dissipation of heat from the heating element 30 occurs. However, in this embodiment of the invention, there is hardly any space between the heating element 30 and the bottom plate 24 as shown in FIG. 4. Therefore, the heating element 30 and the bottom plate 24 may be brought into close contact with each other and fixed to each other through application of a small amount of a heat conductive grease 32. As a result, heat dissipation from the heating element 30 may be ensured. According to this embodiment of the invention, there is a slight decline in heat radiation performance in comparison with a case where the heating element is arranged on the top plate 22 side. However, if, for example, a reactor, a DC/DC converter, or the like is arranged as the heating element 30 and a material having high thermal conductivity such as silicon grease or the like is applied as the heat conductive grease 32, sufficient heat dissipation may be ensured, and a contribution to size reduction of the power module and efficiency enhancement of the heat dissipation device 16 can be made.

Figure 5:
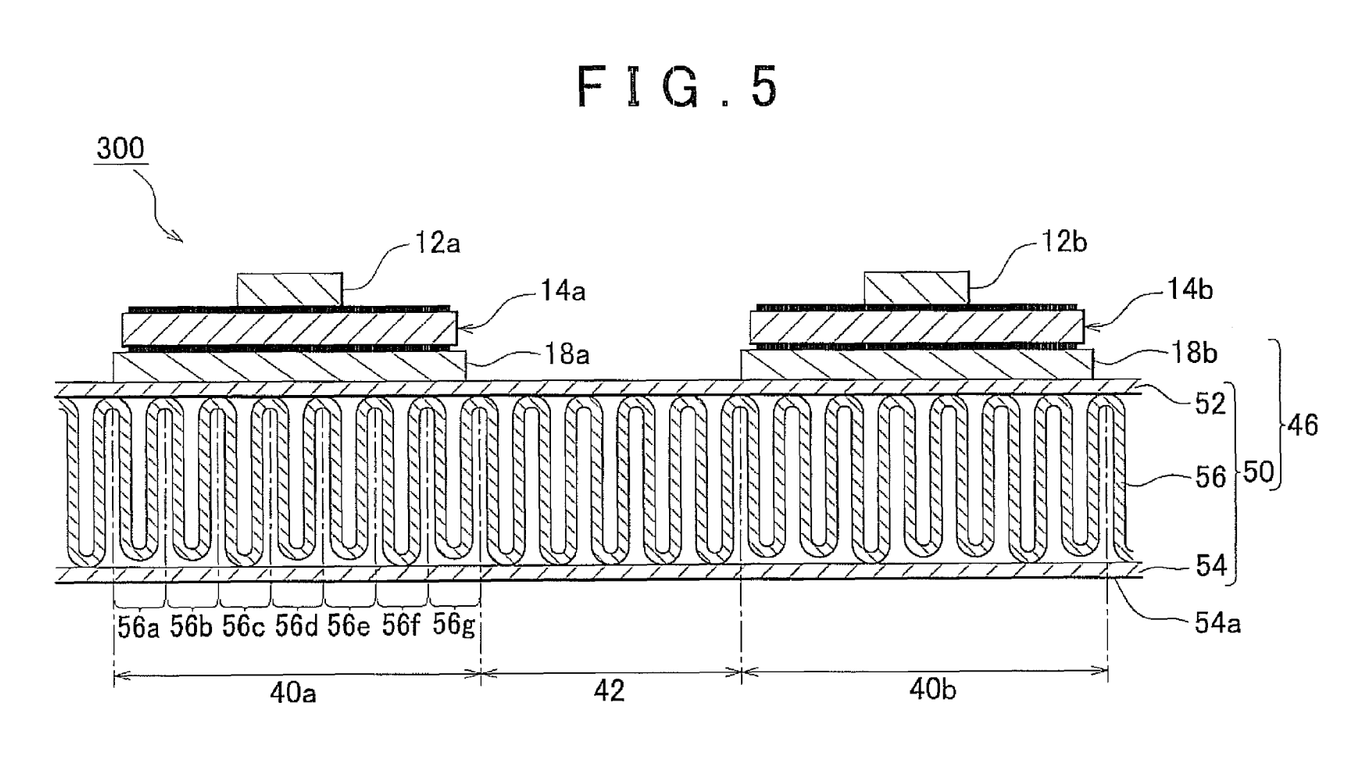
FIG. 5 is a cross-sectional view showing the outline of the structure of a power module according to a third embodiment of the invention.

FIG. 5 is a cross-sectional view showing the outline of the structure of a power module according to a third embodiment of the invention. A power module 300 shown in FIG. 5 is substantially identical in construction to the power module 100 shown in FIG. 1 but differs in that it is configured to dissipate heat from a plurality of semiconductor elements 12a and 12b.

In the power module 300 shown in FIG. 5, the shape of a radiator fin 56 in joint areas 40a and 40b where a heat dissipation device 46 including heat dissipation plates 18a and 18b and a radiator 50 is joined to insulating substrates 14a and 14b differs from the shape of the radiator fin 56 in a non-joint area 42 where the heat dissipation device 46 is not joined to the insulating substrates 14a and 14b. That is, in the joint area 40a, as with the radiator fin 26 shown in FIG. 2, the radiator fin 56 has regions (56c and 56f) where the radiator fin 56 is joined to a bottom plate 54, and regions (56a, 56b, 56d, 56e, and 56g) where the radiator fin 56 is not joined to the bottom plate 54. In the joint area 40b as well, the radiator fin 56 assumes substantially the same shape as in the joint area 40a. On the other hand, the insulating substrates, which may constitute a factor in deformation of the heat dissipation device, are not joined to the heat dissipation device in the non-joint area 42. Therefore, with the regions (56c and 56f) of the joint area 40a, all the peak portions of the radiator fin 56 are joined to the top plate 52 or the bottom plate 54. According to this embodiment of the invention, in the joint areas 40a and 40b with the insulating substrates 14a and 14b, a certain level of heat dissipation may be ensured, and deformation of the heat dissipation device may be prevented or minimized. A configuration with high heat dissipation is adopted in the non-joint area 42. Thus, the heat dissipating device may be prevented or restrained from becoming deformed while maintaining heat dissipation in the entire power module 300.

In the embodiment of the invention shown in FIG. 5, as with the configuration shown in FIG. 4, a heating element (not shown) may be provided on an outer face 54a of the bottom plate 54 on the opposite side of the radiator fin 56. In this case, the heating element (not shown) may be provided at either the joint areas 40a and 40b or the non-joint area 42. Further, the heating element may also be arranged to straddle the non-joint area 42 and at least one of the joint areas 40a and 40b. According to this embodiment of the invention, the radiator 50 may be efficiently utilized. Therefore, a contribution to size reduction of the power module can be made.

The invention may be utilized for various power modules such as a hybrid (HV) inverter mounted on a hybrid vehicle and the like.

What is claimed is:

1. A heat dissipation device provided on one face side of an insulating substrate, which has a semiconductor element disposed on the other face side thereof, comprising:

a first planar member that includes an insulating substrate-side joint face joined to the insulating substrate, and a first joint face on the side of the first planar member opposite the insulating substrate-side joint face;

a second planar member that includes a second joint face that faces the first joint face; and a radiator fin that is corrugated and arranged between the first planar member and the second planar member, wherein a peak portion of the radiator fin is joined to the first joint face, and the radiator fin includes a first region that has a height in an amplitude direction which is equal to a distance between the first planar member and the second planar member and includes a joint peak portion joined to the second joint face and a second region that has a height in the amplitude direction which is shorter than the distance between the first planar member and the second planar member and includes a non-joint peak portion separated from the second joint face by a gap.

2. The heat dissipation device according to claim 1, wherein
the radiator fin includes a plurality of first regions, and
the plurality of the first regions are provided at equidistant intervals.

3. The heat dissipation device according to claim 1, wherein
the gap separating the second region from the second joint face is at most 1 mm.

4. The heat dissipation device according to claim 1, wherein
a plurality of the radiator fins is provided between the fist planar member and the second planar member, is adjacent to one another across gaps having a predetermined width respectively, and is arranged out of phase with one another.

5. The heat dissipation device according to claim 1, further comprising
a heat dissipation plate that is arranged between the insulating substrate and the first planar member and that is made of a material having a higher thermal conductivity than the insulating substrate.

6. The heat dissipation device according to claim 1, wherein
the second planar member has a heating element fixing face that is located on the side of the second planar member opposite from the second joint face to fix a heating element.

7. The heat dissipation device according to claim 6, wherein
the heating element is a reactor or a DC/DC converter.

8. A power module comprising:
an insulating substrate;
a semiconductor element provided on one face of the insulating substrate;
a first planar member arranged on an opposite face side of the insulating substrate from the semiconductor element that includes an insulating substrate-side joint face joined to the insulating substrate, and a first joint face on the side of the first planar member opposite the insulating substrate-side joint face;
a second planar member that includes a second joint face that faces the first joint face; and
a radiator fin that is corrugated and arranged between the first planar member and the second planar member, wherein a peak portion of the radiator fin is joined to the first joint face, and the radiator fin includes a first region that has a height in an amplitude direction which is equal to a distance between the first planar member and the second planar member and includes a joint peak portion joined to the second joint face and a second region that has a height in the amplitude direction which is shorter than the distance between the first planar member and the second planar member and includes a non-joint peak portion separated from the second joint face by a gap.

9. The power module according to claim 8, wherein:
portions of the radiator fin joined to the first planar member on a side opposite from where the insulating substrate is joined to the first planar member include the joint peak portion and the non-joint peak portion; and
portions of the radiator fin joined to the first planar member on the side opposite from where the insulating substrate is not joined to the first planar member include only joint peak portions.

10. The power module according to claim 8, further comprising
a heating element that is fixed to that face of the second planar member opposite from the second joint face.

11. The power module according to claim 10, wherein
a heat conductive grease is applied between the second planar member and the heating element.

12. The power module according to claim 10, wherein
the heating element is a reactor or a DC/DC converter.

* * * * *

UNITED STATES PATENT AND TRADEMARK OFFICE
CERTIFICATE OF CORRECTION

PATENT NO.      : 7,961,474 B2
APPLICATION NO. : 12/684160
DATED           : June 14, 2011
INVENTOR(S)     : Tadafumi Yoshida et al.

Page 1 of 1

It is certified that error appears in the above-identified patent and that said Letters Patent is hereby corrected as shown below:

Column 6, line 38 - delete "560" and insert --56f)--

Signed and Sealed this
First Day of May, 2012

David J. Kappos
*Director of the United States Patent and Trademark Office*